United States Patent [19]
Chen

[11] Patent Number: 5,462,895
[45] Date of Patent: Oct. 31, 1995

[54] METHOD OF MAKING SEMICONDUCTOR DEVICE COMPRISING A TITANIUM NITRIDE FILM

[75] Inventor: Shih-Chang Chen, Tokyo, Japan

[73] Assignee: Oki Electric Industry Co., Ltd., Tokyo, Japan

[21] Appl. No.: 119,440

[22] Filed: Aug. 23, 1993

Related U.S. Application Data

[62] Division of Ser. No. 937,380, Aug. 31, 1992, abandoned.

[30] Foreign Application Priority Data

Sep. 4, 1991 [JP] Japan .................................. 3-224260
Sep. 4, 1991 [JP] Japan .................................. 3-224261

[51] Int. Cl.[6] ............................................. H01L 21/283
[52] U.S. Cl. ........................ 437/200; 437/190; 437/192; 148/DIG. 20
[58] Field of Search ............................. 437/190, 192, 437/195, 200; 257/753; 427/255.2; 148/DIG. 19, DIG. 20

[56] References Cited

U.S. PATENT DOCUMENTS

| 4,570,328 | 2/1986 | Price et al. ............................ 437/192 |
| 4,803,127 | 2/1989 | Hakim ................................. 427/255.2 |
| 4,897,709 | 1/1990 | Yokoyama et al. ..................... 437/190 |
| 4,960,732 | 10/1990 | Dixit et al. ............................ 437/192 |
| 5,049,975 | 9/1991 | Ajika et al. ............................ 437/190 |

FOREIGN PATENT DOCUMENTS

| 63-227019 | 9/1988 | Japan .................................... 437/200 |
| 2-45958 | 2/1990 | Japan . |
| 2-119129 | 5/1990 | Japan . |

OTHER PUBLICATIONS

Bernard, C., et al., "Chemical Vapor Deposition of Refractory Metal Silicides for VLSI Metallization" Solid State Technology, Feb. 1989, pp. 79–84.

Primary Examiner—T. N. Quach
Attorney, Agent, or Firm—Spencer, Frank & Schneider, Christopher H. Lynt

[57] ABSTRACT

In a method of forming an adhesive layer for a blanket layer filling a contact hole in a semiconductor device, a Ti film, Ti-rich TiN film or a $TiSi_x$ (x being 1.1 to 1.8) film is formed, and then a TiN (stoichiometric) film is formed. The Ti film, Ti-rich TiN film or $TiSi_x$ is annealed to be converted into $TiSi_2$ film. The formation of the Ti film, Ti-rich TiN film or a $TiSi_x$ is performed by a continuous CVD process.

6 Claims, 4 Drawing Sheets

METHOD OF MAKING SEMICONDUCTOR DEVICE COMPRISING A TITANIUM NITRIDE FILM

This application is a divisional of application Ser. No. 07/937,380, filed Aug. 31st, 1992 now abandonded.

BACKGROUND OF THE INVENTION

The present invention relates to a method of making a semiconductor device, and in particular to a method of forming a TiN film serving as an adhesive layer by the use of tungsten (W) or the like for filling a contact hole or the like in a semiconductor device.

When a blanket tungsten (W) film is used as a via-filler of a contact hole or the like, a reactive TiN film is often used as an adhesive layer for the tungsten film. The process flow for the formation of the blanket tungsten is shown in FIG. 4A to FIG. 4D. First, a doped or implanted layer 2 is formed at the surface of a Si substrate 1, and an interlayer insulating film 3 of for example BPSG (borophosphosilicate glass) is deposited. A contact hole 5 is then formed by optical lithography to obtain a structure shown in FIG. 4A. Reactive TiN 6 is deposited by sputtering as an adhesive layer for preventing peeling-off of a blanket tungsten film 8 used in a subsequent step. With the TiN film alone, the resistance of the contact is high, so that a pure Ti film 4 is laid (as shown in FIG. 4B), and then a reactive TiN film 6 is deposited. To make the contact Ohmic, annealing is conducted. This turns the Ti layer into a low-resistance $TiSi_2$ layer 7 between the reactive TiN film 6 and the Si substrate 1 (as shown in FIG. 4C). Finally a blanket tungsten film 8 is deposited by CVD ( chemical vapor deposition ), and etching-back, by means of reactive ion etching for example, is conducted to leave tungsten in the contact hole as shown in FIG. 4D. Interconnection, of aluminum for example, is thereafter formed, being in contact with the blanket tungsten film 8.

The above-described method has a shortcoming in that the reactive TiN film or its underlying Ti layer being formed by sputtering has a poor step coverage, and Ti and TiN are difficult to deposit inside the contact hole. This leads to an increase in the resistance of the contact resistance and diffusion of tungsten into the Si substrate during the annealing, and an increase of the leakage current. Moreover, because of the poor step coverage, control of the thicknesses of the Ti and TiN inside the contact hole is difficult.

SUMMARY OF THE INVENTION

An object of the invention is to improve the step coverage of the TiN film inside the contact hole.

Another object of the invention is to enable formation of the TiN film and a TiSix film through a single deposition step and a heat treatment after the deposition of the blanket tungsten film.

In a method according to the invention, a Ti film, Ti-rich TiN film (TiN film containing not less than 50% of Ti) or a $TiSi_x$ (x being 1.1 to 1.8) film is formed, and then a TiN (stoichiometric) film is formed. The Ti film, Ti-rich TiN film or $TiSi_x$ is annealed to be converted into $TiSi_2$ film. The formation of the Ti film, Ti-rich TiN film or a $TiSi_x$ is performed by a continuous CVD process.

DETAILED DESCRIPTION OF THE PREFERRED EMBODIMENTS

First Embodiment

Figure 1A:
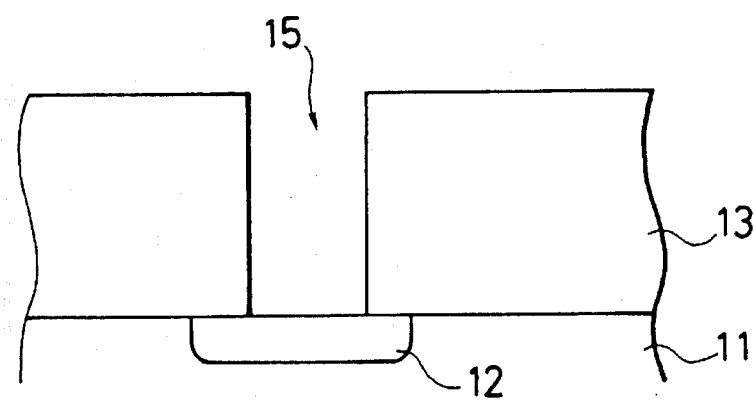
FIG. 1A to FIG. 1C are sectional views showing the semiconductor device at various process steps of production in a first embodiment of the invention.
Figure 1B:
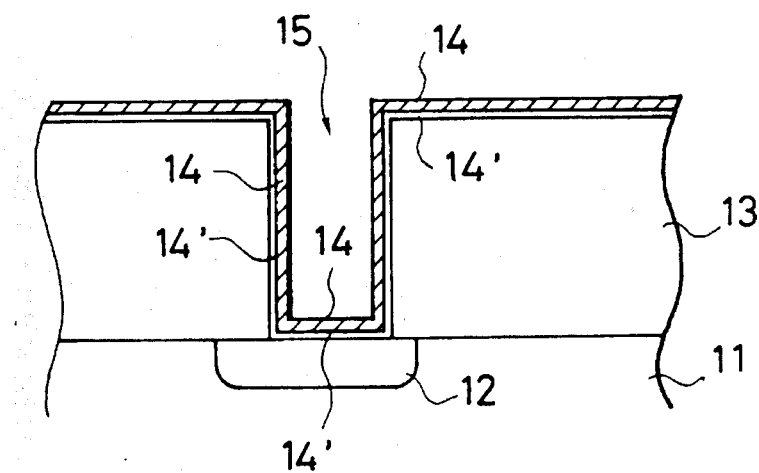

A first embodiment will be described with reference to FIG. 1A to FIG. 1C.

First, an implanted layer 12 is formed at the surface of a Si substrate 11, in the same way as in the related art. An interlayer insulating film 13 is then deposited, and a contact hole 15 is formed to obtain a structure shown in FIG. 1A. A TiN film 14 is then deposited by CVD, as shown in FIG. 1B. In the beginning of the CVD of the TiN film 14, the flow ratio between the source gas, e.g., $TiCl_4$, containing Ti and a source gas, e.g., $NH_3$, containing N, is initially set to form a Ti-rich TiN film, and then changed to a value resulting in a stoichiometric TiN film. The term stoichiometric film is a film having a minimum enthalpy of formation, i.e., being most stable. The ratio for forming the Ti-rich TiN film is 20:1 or more, for example. The ratio for forming the stoichiometric TiN film is a suitable value between 10:1 and 20:1. The period for which the ratio is set to form the Ti-rich TiN film is one third of the entire CVD period, at the beginning of such a period. In this way, through a single deposition step, an adhesive TiN film comprising a Ti-rich TiN film 14' and a stoichiometric TiN film 14 is formed.

Figure 1C:
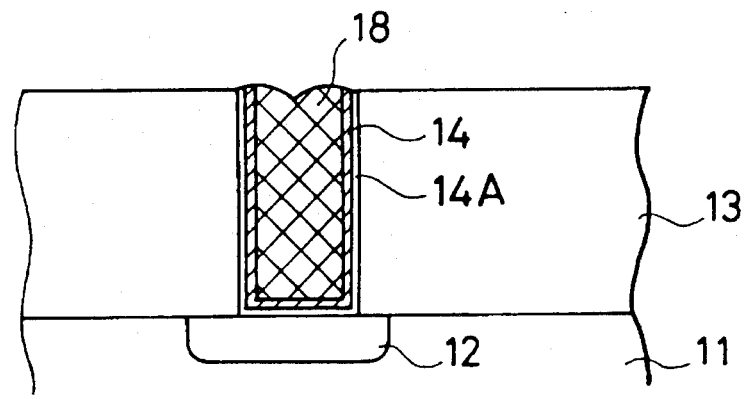

A blanket tungsten film 18 is then formed by CVD, and etching-back is conducted to leave tungsten in the contact hole (FIG. 1C).

In this way, a Ti-rich TiN film 14' used for formation of a $TiSi_x$ film for lowering the contact resistance, and a TiN film used as an adhesive layer (having a barrier effect) for the tungsten film 18 are formed between the implanted layer 12 and the tungsten film 18 by a single or continuous deposition step.

By a subsequent heat treatment (annealing), the Ti-rich TiN film 14' is turned into a $TiSi_2$ film 14A having a low resistance.

By the above method, a TiN adhesive layer 14 in the contact hole containing the $TiSi_2$ layer 14A, having a low resistance, is formed between the implanted layer 12 and the tungsten film 18.

Second Embodiment

Figure 2A:
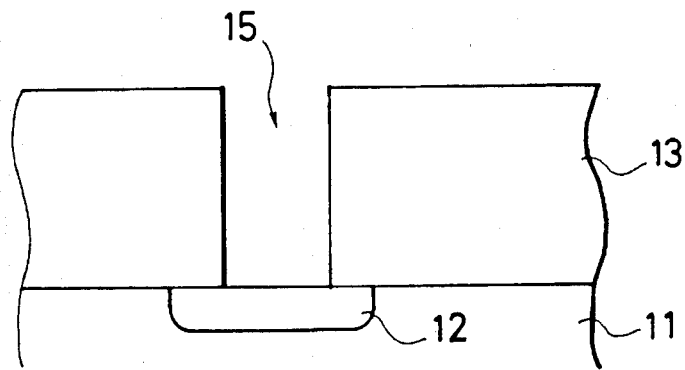
FIG. 2A to FIG. 2C are sectional views showing the semiconductor device at various process steps of production in a second embodiment of the invention.
Figure 2B:
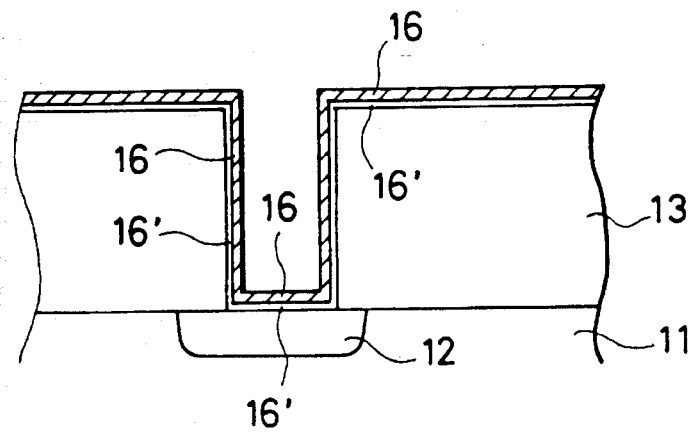

A second embodiment of the invention will now be described with reference to FIG. 2A to FIG. 2C.

Like the first embodiment, an implanted layer 12 is formed at the surface of a Si substrate 11. An interlayer insulating film 13 is then deposited, and a contact hole 15 is formed to obtain a structure shown in FIG. 2A. Then an adhesive layer is formed. In this embodiment, in place of the Ti-rich TiN film, a Ti film is formed as the layer for decreasing the Ohmic contact. For this purpose, $TiCl_4$ and $H_2$ are initially used as source gases to form a thin Ti film 16', and then $TiCl_4$ and $NH_3$ are used as source gases to form a TiN film 16. The supply of $TiCl_4$ is continued for one fourth to one fifth of the entire CVD period at the beginning of such a CVD period. Then, the supply of $H_2$ gas is then terminated, and supply of $NH_3$ gas is commenced.

Figure 2C:
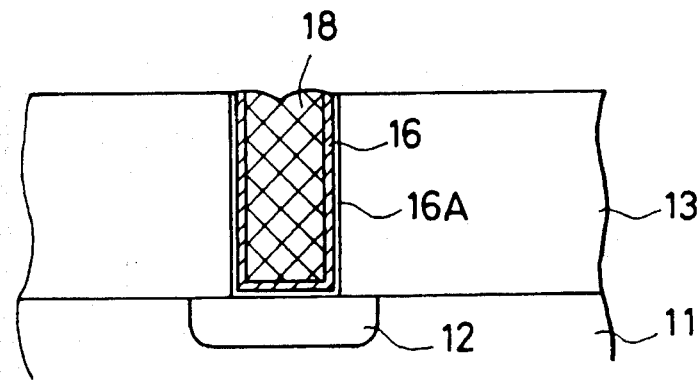

Like the first embodiment, a blanket tungsten film 18 is then formed by CVD, and etching-back is conducted to leave tungsten in the contact hole (FIG. 2C).

In this way, a Ti film 16' used for formation of a TiSi$_x$ film for lowering the contact resistance, and a TiN film used as an adhesive layer (having a barrier effect) for the tungsten film 18 are formed between the implanted layer 12 and the tungsten film 18 by a single or continuous deposition step.

By a subsequent heat treatment, the Ti film 16' is turned into a TiSi$_2$ film 16A having a low resistance.

By the above method, a TiN adhesive layer 16' in the contact hole, containing the TiSi$_2$ layer 16A, having a low resistance, is formed between the implanted layer 12 and the tungsten film 18.

As has been described, according to the first and second embodiments described above, a Ti or Ti rich TiN film used for formation of the TiSi$_x$ film for lowering the contact resistance and a TiN film used as an adhesive layer for the tungsten film are both formed by changing the flow ratio between source gases or switching the source gases from one to another. The number of process steps is therefore reduced, and the step coverage of the adhesive layer is improved, and the quality of the film inside the contact hole is improved.

Third Embodiment

A problem associated with the first embodiment is that with the size reduction of the semiconductor devices, it is difficult to form a TiSi$_2$ film to an adequate thickness. Moreover, the silicidation to form the TiSi$_2$ film consume silicon in the junction area, and leads to the junction leakage.

A third embodiment of this invention which will next be described is intended to solve this problem.

Figure 3A:
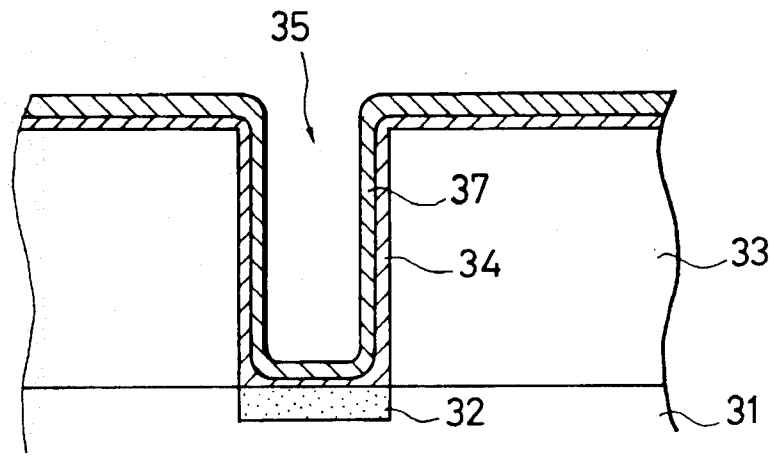
FIG. 3A and 3B are sectional views showing the semiconductor device at various process steps of production in a third embodiment of the invention.
Figure 3B:
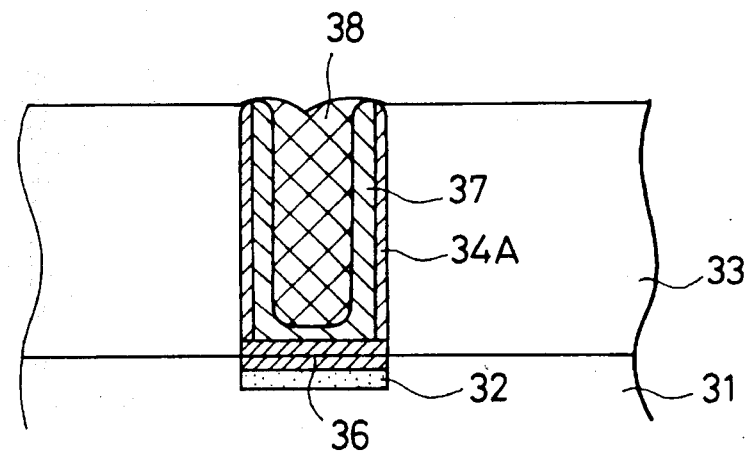
Figure 4A:
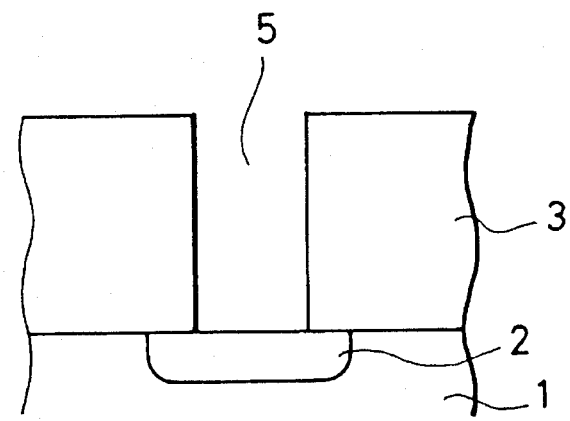
FIG. 4A to FIG. 4D are sectional views showing the semiconductor device at various process steps of production in a conventional method.
Figure 4B:
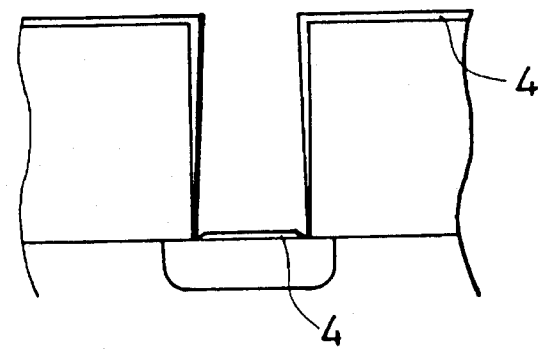
Figure 4C:
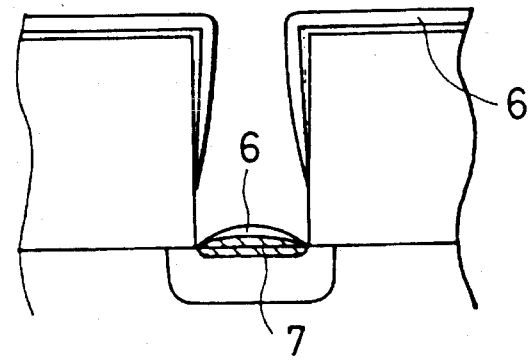
Figure 4D:
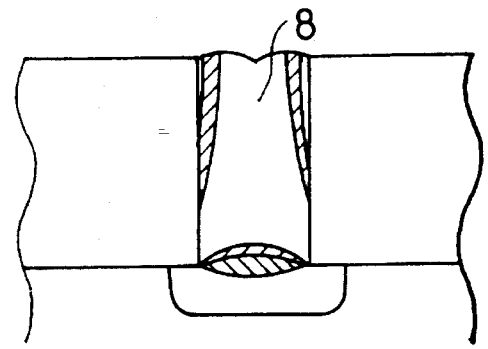

Referring to FIG. 3A and FIG. 3B, illustrating the third embodiment, an interlayer insulating film 33 is formed on a substrate 31 on which an implanted layer 32 has been formed, and etched to form a contact hole 35 (FIG. 3A). A Ti-rich TiSi$_x$ film 34 is then deposited unselectively, i.e., throughout the entire surface of the substrate, and then a TiN film 37 is deposited. The deposition of the TiSi$_x$ film 34 and the deposition of the TiN film 37 are conducted in the same film forming chamber.

The steps of these depositions are described in more detail. First, a wafer on which the contact holes have been formed is set in the film forming chamber, and a Ti-rich TiSi$_x$ film 34 is formed, with x being 1.1 to 1.8, by a PE-CVD (plasma-enhanced CVD) method, in which SiH$_4$ gas and TiCl$_4$ gas are used as source gases, with their flow ratio being 1.5 to 3.0, the pressure is 1.0 to 2.0 Torr, and the temperature is 300° to 600° C., and the applied RF power is 200 to 800 W. After the Ti-rich TiSi$_x$ film 34 is formed, supply of the SiH$_4$ gas is terminated. Then, NH$_3$ gas and TiCl$_4$ gas are used as source gases, to form the TiN film 34. The flow ratio between the NH$_3$ gas and the TiCl$_4$ gas is set to form a stoichiometric TiN film, e.g., at 1/10 to 1/20. The pressure, temperature and RF power may be unchanged. They may alternatively be changed, but it is better that they be kept unchanged to attain a higher throughput.

Subsequently, a blanket tungsten film 38 is formed by CVD, and etching-back is conducted. The Ti-rich TiSi$_x$ film 34, and the TiN film 37, and the blanket film 38 on the interlayer insulating film 33 are etched off by this etching-back. The layer configuration in the contact hole in the resultant structure comprises a Ti-rich TiSi$_x$ film, a TiN film and a tungsten film arranged in the stated order from the bottom. Then, a heat treatment is conducted to convert Ti-rich TiSi$_x$ film 34 into TiSi$_{2.0}$ film 34A.

During the heat treatment, the Ti-rich TiSi$_x$ film 34 consumes silicon in the underlying junction area to become TiSi$_{2.0}$. But as the value of "x" of the composition of the TiSi$_x$ is 1.1 to 1.8, the amount of silicon required to form TiSi$_{2.0}$ is less than half compared with the case in which a pure Ti film is used. As a result, a TiSi$_{2.0}$ film having a sufficient thickness can be formed. The resistance can therefore be lowered. Even if the depth of the junction area is decreased with the size reduction of the devices, the possibility of junction leakage is reduced.

With the third embodiment, the Ti-rich TiSi$_x$ is formed, and then TiN film is formed in the same film forming chamber, so that when the heat treatment is conducted to convert the TiSi$_x$ film to a TiSi$_{2.0}$ film, the consumption of silicon in the junction area is reduced, and even if the depth of the junction is increased the possibility of the junction leakage is decreased, while the resistance of the contact is lowered.

In the embodiments described above, the heat treatment to form TiSi$_2$ is conducted after the formation of the blanket tungsten film. It is however possible to conduct the heat treatment before the formation of the blanket tungsten film.

In the embodiments described above, tungsten is used to fill the contact hole. Other kinds of refractory metal such as molybdenum (Mo) or chromium (Cr), or other kinds of non-refractory metal, such as aluminum, may also be used.

What is claimed is:

1. A method of making semiconductor device comprising the steps of:

forming a Ti-rich TiN film in a contact hole formed on a silicon substrate;

forming a stoichiometric TiN film in the contact hole on the Ti-rich TiN film;

forming a blanket film in the contact hole on the stoichiometric TiN film; and conducting a heat treatment to convert the Ti-rich TiN film into a TiSi$_2$ film before or after the formation of the blanket film;

wherein the formation of the Ti-rich TiN film and the formation of the stoichiometric TiN film are conducted by a continuous CVD process using a gas containing Ti and a gas containing N as source gases, and initially setting the flow ratio between the Ti-containing gas and the N-containing gas to form the Ti-rich TiN film and then altering the flow ratio into a value for forming the stoichiometric TiN film.

2. The method of claim 1, wherein the formation of the Ti-rich TiN film and the formation of the TiN film are conducted by CVD using the same film-forming chamber and continously.

3. The method of claim 1, wherein the Ti-containing gas is TiCl$_4$ and the N-containing gas is NH$_3$, and the flow ratio between them during the formation of the Ti-rich TiN film is at least 20:1, and the flow ratio between them during the formation of the stoichiometric TiN film is between 10:1 and 20:1.

4. The method of claim 3, wherein the formation of the Ti-rich TiN film lasts about one third of the entire period of the formation of the Ti-rich TiN film and the formation of the stoichiometric TiN film.

5. The method of claim 1, wherein said contact hole is formed on said silicon substrate, at an area where an implanted layer is formed.

6. The method of claim 1, wherein said blanket layer is formed of a refractory metal selected from the group consisting of tungsten, molybdenum and chromium.

* * * * *